United States Patent [19]
Smith

[11] 4,394,860
[45] Jul. 26, 1983

[54] SOLAR LIGHT BULB
[76] Inventor: Derrick A. Smith, P.O. Box 1974, Hollywood, Fla. 33020
[21] Appl. No.: 191,122
[22] Filed: Sep. 26, 1980
[51] Int. Cl.³ .............................................. F23J 3/02
[52] U.S. Cl. .................... 126/439; 126/417; 126/438; 126/451; 350/258; 362/93; 362/147; 362/253; 362/266
[58] Field of Search ............... 126/438, 439, 440, 417, 126/451; 350/264, 258–263, 265; 362/1, 32, 34, 84, 93, 209, 218, 251, 253, 145, 147, 266, 458

[56] References Cited
U.S. PATENT DOCUMENTS

| 1,254,520 | 1/1918 | Macduff | 350/262 |
|---|---|---|---|
| 1,275,871 | 8/1918 | Dodds et al. | 362/84 |
| 2,853,596 | 9/1958 | Weitzner | 362/145 |
| 3,184,586 | 5/1965 | Hammes et al. | 362/86 |
| 3,196,366 | 7/1965 | Simpson | 126/451 X |
| 3,511,559 | 5/1970 | Foster | 350/258 |
| 3,902,056 | 8/1975 | Aizenberg et al. | 350/264 |
| 4,126,379 | 11/1978 | Wu | 350/260 |
| 4,152,752 | 5/1979 | Niemi | 362/209 X |
| 4,246,477 | 1/1981 | Latter | 350/262 |

Primary Examiner—Larry Jones

[57] ABSTRACT

A system for generating light directly using solar energy is provided herein. It includes a concentrator and accumulator for the sun's rays to generate a concentrated beam of visible solar radiation. A distributor shaft is provided for distributing the beam of visible solar radiation. A fork is provided in the distributor shaft to define a plurality of branch lines, each provided with a mirror at the intersection to direct the beam down the respective branch line to permit parallel fractions of the beam to be reflected off the respective mirrors and to pass down the respective branch line. A solar bulb is provided including a double walled upper bulbous portion including the inlet from the branch line and a pair of heat outlet tubes, and a double walled lower bulbous portion, the upper portion thereof being divergently reflective, with the lower portion having walls which are either transparent or translucent to provide greater light diffusion, and the space between the two walls being maintained under vacuum to provide heat insulation values. A structure is provided within the solar bulb for the absorption and radiation of the concentrated beam of visible solar radiation. Preferably structure is provided connected to the solar bulb to draw in outside air in the summer to direct it past the solar bulb and to air vent hot air produced at the solar bulb to the outside, thereby providing light with minimal heat in the summer. The same structure is operated in the winter to draw in household air to direct it past the solar bulb and to recirculate such heated air produced at the solar bulb to the house, thereby providing light and heat in the winter.

14 Claims, 6 Drawing Figures

SOLAR LIGHT BULB

BACKGROUND OF THE INVENTION (i) Field of the Invention

This invention relates to a system for generating light using solar energy.

(ii) Description of the Prior Art

Conventionally light is generated by heat energy converted to light by fluorescence or by incandescence. The primary energy source is electricity to heat an incandescent filament or to heat a fluorescent gas.

SUMMARY OF THE INVENTION (i) Aims of the Invention

It would therefore be desirable to provide a system whereby solar heat can be use directly for the absorption and radiation of the concentrated beam of visible solar radiation without the intermediary generation of electricity.

(ii) Statement of the Invention

By this invention, a system is provided for generating light directly using solar energy comprising: (a) a concentrator and accumulator for the sun's rays to generate a concentrated beam of visible solar radiation: (b) a distributor shaft for distributing the beam of visible solar radiation; (c) a fork in the distributing shaft providing a plurality of branch lines, each provided with a reflecting mirror at the intersection to direct the beam down the branch line to permit parallel fractions of the beam to be reflected off the respective mirrors and to pass down the respective branch line; (d) a solar bulb including a double walled upper bulbous portion including the inlet from the branch line and a pair of heat outlet tubes, and a double walled lower bulbous portion, the upper portion thereof being divergently reflective, with the lower portion having walls which are either transparent or translucent to provide greater light diffusion, and the space between the two walls being maintained under vacuum to provide heat insulation values; and (e) means within the solar bulb for the absorption and radiation of the concentrated beam of visible solar radiation.

(iii) Other Features of the Invention

By one feature thereof, the cross-sectional area of the distributor shaft decreases as the distance from the fork increases.

By another feature, the means (e) includes a sealed vacuum secondary reflector bulb within the solar bulb including a reflecting cone at the base thereof, upper portions of the reflector bulb including a pair of convex light reflecting mirrors, the lower portion of the reflector bulb including a pair of angularly positioned flat light reflecting mirrors.

By a further feature, the means (e) includes a secondary sealed vacuum reflector bulb within the solar bulb, and includes a lower convex heat reflecting mirror, and an upper one-way type heat reflecting convex mirror, and disposed between the two heat reflecting mirrors is a conventional material which produces luminous light when heated.

By other features thereof, such material can be a glowing gas mantle or a fluorescent gas.

By another feature, the means (e) includes a secondary sealed vacuum reflector bulb within the solar bulb and is formed of globular one-way mirrored material with a heat reflecting surface, and therewithin is an incandescent filament which creates light when heated.

By a further feature of any of the above features, the system includes a supplementary source of electricity, whose power is controlled to be dependent inversely on the absolute quantity of concentrated beam of visible solar energy within the branch line.

By another feature of any of the above features, the system includes fan means to withdraw heat from the bulbs, to be vented outdoors to provide a system with a minimum of heat in the summer.

By another feature, the fan motor would be turned off during the winter thereby permitting radiant heating from sunlight when required, e.g., in the winter.

Heating may also be accomplished by another feature by circulating heat from the solar bulb indoors.

Thus, preferably structure is provided connected to the solar bulb to draw in outside air in the summer to direct it past the solar bulb and to air vent hot air produced at the solar bulb to the outside, thereby providing light with minimal heat in the summer. The same structure is operated in the winter to draw in household air to direct it past the solar bulb and to recirculate such heated air produced at the solar bulb to the house, thereby providing light and heat in the winter.

BRIEF DESCRIPTION OF THE DRAWINGS

In the accompanying drawings.

Figure 1:
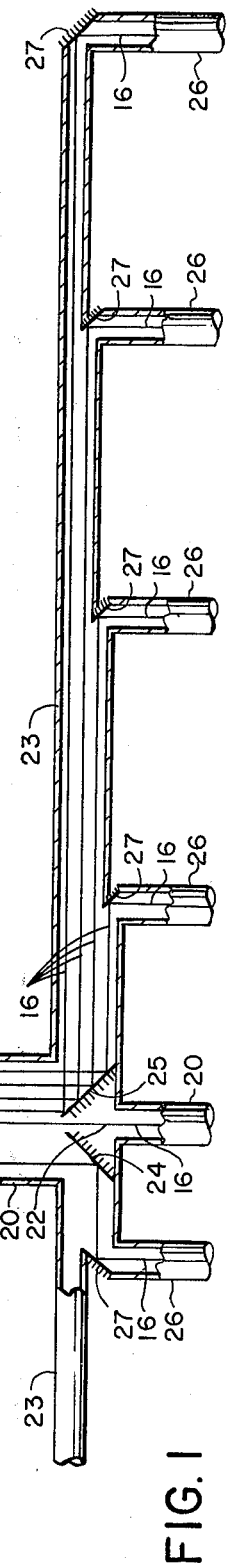
FIG. 1 is a schematic drawing of a sun collector and distributor line.
Figure 1:
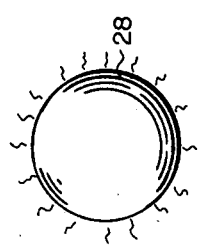
Figure 1:
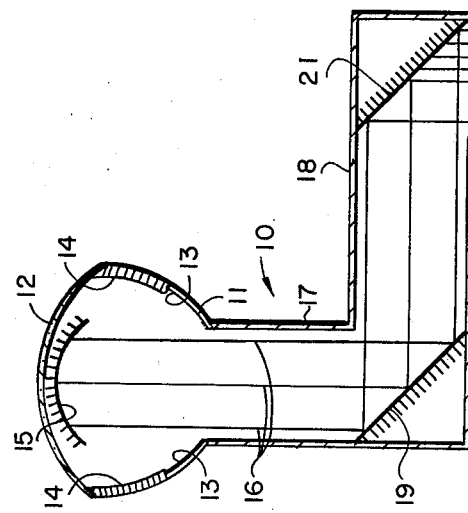

DESCRIPTION OF PREFERRED EMBODIMENTS (i) Description of FIG. 1

The solar collector system 10 shown in FIG. 1 includes a collector bulb 11 having a heat and light transparent face 12, with converging side walls 13. Along the upper portion of the converging walls are mirrored surfaces 14 which reflect the converging sun's rays to a convex mirror 15 which directs a concentrated beam of solar radiation 16 downwardly through main down shaft 17. A connector shaft 18 extends at right angles to main down shaft 17. A mirror 19 is disposed at the intersection between the main down shaft 17 and the distributor shaft 18. A downcomer shaft 20 extends at right angles to the distributor shaft 18 and a mirror 21 is also disposed at the intersection of the distributor shaft 18 and the downcomer shaft 20. At the base of the downcomer shaft and extending in both directions at right angles thereto is a fork 22 leading to a distributor shaft 23 with a pair of reflecting mirrors 24,25 directing the concentrated beam of visible solar radiation 16 along the distributor shafts 23. It is noted that the distributor shafts 23 are provided with a plurality of branch lines 26, each provided with a mirror 27 at the intersection to direct the concentrated beam of visible solar radiation down the branch line. At the end of each branch line 26 (although not shown) is one of the three alternative embodiments of the solar bulb to be described in detail in FIGS. 4–6. It is further noted that the cross-sectional area of the solar heat/light distributor shaft 23 decreases as the distance from the fork 22 increases, to permit parallel fractions of the concentrated beam of visible solar radiation 16 to be reflected off the respective mirrors 27 and pass down the respective branch line 26.

Figure 4:
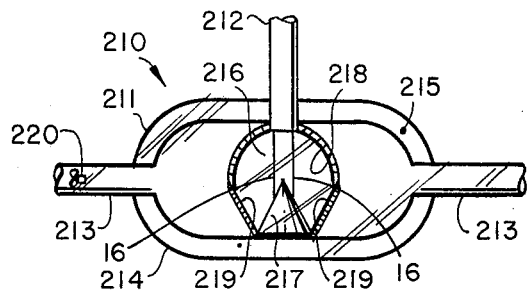
FIG. 4 is a schematic drawing of one embodiment of a solar light bulb.
Figure 5:
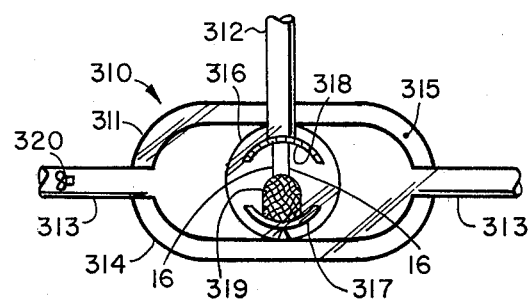
FIG. 5 is a schematic drawing of a second embodiment of a solar light bulb.
Figure 6:
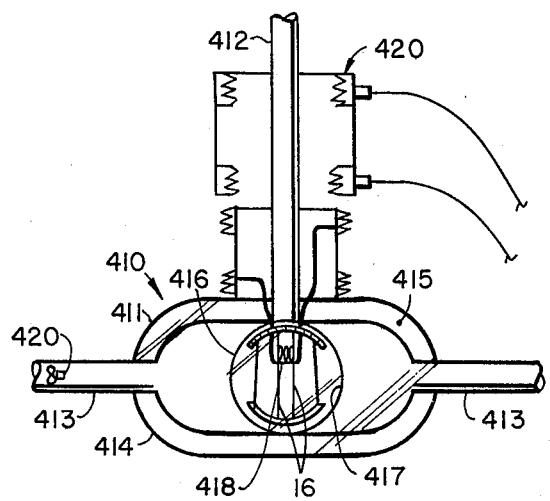
FIG. 6 is a schematic drawing of a third embodiment of a solar light bulb.

As seen in FIGS. 4, 5 and 6, the solar bulb 210, 310, 410 includes a double walled upper bulbous portion 211, 311, 411 including the inlet 212, 312, 412 from the branch line 26 and a pair of heat outlet tubes 213, 313, 413 and a double walled lower bulbous portion 214, 314, 414 connected thereto in a heat insulating manner. The outer walls of the upper 211, 311, 411 portions are divergently transparent and the walls of the lower 214, 314, 414 portions are transparent or translucent to provide greater light diffusion. The space 215, 315, 415 between the two walls is maintained under vacuum to provide heat insulation valves. The means for the absorption and re-radiation of the concentrated heat/light beam to light will now be described individually for FIGS. 4, 5 and 6.

Figure 2:
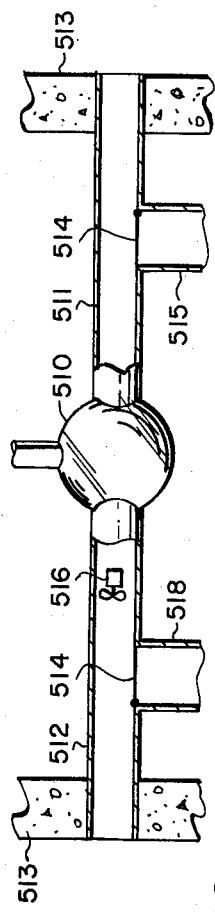
FIG. 2 is a schematic drawing of a solar bulb hook-up for summer use.

(ii) Description of FIG. 2

As seen in FIG. 2, a solar bulb schematically illustrated as 510 is shown connected by conduits 511, 512 between two outside walls 513 to be vented to the outside through the walls. For summer operation, a flip valve 514 across an internal duct 515 is closed to allow the air stream to travel from the outside to the solar bulb 510. A fan 516 draws such heated air past the solar bulb 510 into conduit 512. A flap valve 517 at the entrance to duct 518 is closed so that the air stream travels through conduit 512 and thus is vented to the outside. In this way, a virtually heat-free lighting system is provided.

Figure 3:
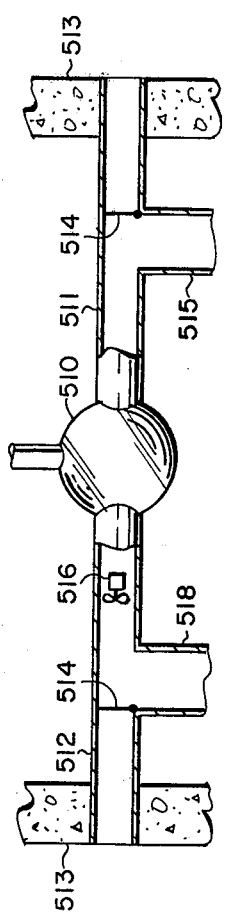
FIG. 3 is a schematic drawing of a solar bulb hook-up for winter use.

(iii) Description of FIG. 3

FIG. 3 is virtually identical in structure to FIG. 2. The only difference is that in FIG. 3 flap valves 514 and 517 are opened so that household air is drawn up through duct 515 and conduit 511 past the solar bulb 510 to be heated and directed and recirculated back to the household through conduit 512 and duct 518. In this way the solar bulb 510 provides both light and heat.

(iv) Description of FIG. 4

In FIG. 4, the light is provided exclusively by reflection and re-reflection. Within the solar bulb 210 is a sealed secondary reflector bulb 216 optionally maintained under vacuum and including a reflecting cone 217 at the base thereof. The upper portions of the reflector bulb 216 include a pair of convex light-reflecting mirrors 218, while the lower portion of the reflector bulb 216 includes a pair of angularly positioned, flat, light-reflecting mirrors 219.

(v) Description of FIG. 5

As seen in FIG. 5, the sealed secondary reflector bulb 316 maintained under vacuum includes a lower, convex, heat-reflecting mirror 317, and an upper, one-way type heat-reflecting convex mirror 318. Disposed between the two heat-reflecting mirrors 317, 318 is a glowing gas mantle 319 or a source of fluorescent gas, or any other conventional material which produces luminous light when heated.

(vi) Description of FIG. 6

As seen in FIG. 6, the sealed secondary reflector bulb 416 maintained under vacuum is formed of a globular one-way mirrored material with a heat reflecting surface 417. Therewithin is an incandescent filament 418 which creates light when heated. Connected to the incandescent filament is a supplemental source of electricity 420, whose power is controlled (by means not shown) dependent inversely on the absolute quantity of concentrated solar heat beam within the branch line.

OPERATION OF PREFERRED EMBODIMENTS (i) Operation of Embodiment of FIG. 1

In operation, diffuse sunlight from the sun 28 is collected and concentrated in the solar collector 11 and is dispersed as a plurality of parallel beams of concentrated visible solar radiation 16 along the distributors 23. Then it is reflected down the respective branch lines 26 to the solar light bulbs 210, 310, 410 where the concentrated beam of visible solar radiation is abosrbed and re-radiated to light.

(ii) Operation of the Embodiment of FIG. 4

In the embodiment shown in FIG. 4, the concentrated solar heat/light beam 16 is reflected and re-reflected within the light reflector bulb 216 by the one-way mirrors, whether they be convex or flat, constituting the reflector bulb. The heat/light beam is thus transfored directly to light by reflection.

(iii) Operation of the Embodiment of FIG. 5

In the embodiment shown in FIG. 5, the concentrated solar heat/light beam 16 is first passed through the one-way spheroidal heat reflector bulb 316 to a central region of high heat. In that region is a gas mantle 319 or a source of a gas which glows when heated. The solar concentrated beam of visible solar radiation 16 is thus absorbed and re-radiated to light indirectly by fluorescence.

(iv) Operation of the Embodiment of FIG. 6

In the embodiment shown in FIG. 6, the concentrated heat/light beam 16 passes through the one-way heat reflector bulb 416 to a central region of high heat. In that region is disposed an incandescent filament 418. Thus, the concentrated beam of visible solar radiation 16 is absorbed and re-radiated to light indirectly by incandescence.

(v) Optional Operation of Embodiments of FIGS. 5 and 6

An auxiliary feature of the embodiments of FIGS. 5 and 6 is the supplemental source of electricity to heat the fluorescent material 319 or the incandescent filament 418 to assist in the generation of light. The quantum of electricity is inversely proportional to the quantum of concentrated beam of visible solar radiation in the respective branch lines. Thus, the amount of electricity needed is little if any on a bright day but may be maximum on cloudy or rainy days.

(vi) Optional Operation of Other Embodiments

Another auxiliary feature of all the embodiments of the solar bulbs is the means previously described with reference to FIGS. 2 and 3, regarding summertime and wintertime operation of the solar bulbs. As described hereinbefore, the convection heat produced at the solar bulbs may be vented outdoors to allow minimal heating effect in summer, or may be recirculated indoors to provide an indoor heating effect in winter.

SUMMARY

From the foregoing description, one skilled in the art can easily ascertain the essential characteristics of this invention, and without departing from the spirit and scope thereof, can make various changes and modifications of the invention to adapt it to various usages and conditions. Consequently, such changes and modifications are properly, equitably, and "intended" to be, within the full range of equivalent of the following claims.

I claim:

1. A system for generating light directly using solar energy comprising:
   (a) a single master concentrator and accumulator for the sun's rays to generate a concentrated beam of visible solar radiation;
   (b) a single master distributor shaft for distributing said beam of visible solar radiation as a collimated light;
   (c) a fork in said single master distributor shaft providing a pair of branch shafts extending in opposite directions, the fork being provided with a pair of mirrors to direct said collimated light beam along each branch shaft, each branch shaft being provided with a plurality of light-ray conducting tubes extending at right angles to said branch shaft, each branch shaft being provided with a mirror at the intersection of said branch shaft with said light-ray conducting tube to direct said beam down each said light-ray conducting tube by reflecting parallel fractions of said beam, the cross-sectional area of said branch shaft decreasing as the distance from the fork increases;
   (d) a solar bulb operatively associated with each light-ray conducting tube, said solar bulb including a double walled upper bulbous portion providing an inlet from said light-ray conducting tube and a pair of heat outlet tubes, and a double walled lower bulbous portion, the upper portion thereof being divergently reflective, with the lower portion having walls which are either transparent or translucent to provide greater light diffusion, and the space between the two walls being maintained under vacuum to provide heat insulation values;
   and (e) means within said solar bulb for the absorption and radiation of said concentrated beam of visible solar radiation.

2. The system of claim 1 wherein said means (e) includes a sealed vacuum secondary reflector bulb within the solar bulb including a reflecting cone at the base thereof, upper portions of said reflector bulb including a pair of convex light reflecting mirrors, the lower portion of the reflector bulb including a pair of angularly positioned flat light reflecting mirrors.

3. The system of claim 2 including fan means to withdraw heat from said bulbs, to be vented outdoors to provide a system of light with a minimum of heat.

4. The system of claim 2 including fan means which is operative to circulate heat from the solar bulbs to the indoors or which is inactive to permit radiant indoor heating from the solar bulbs, when required.

5. The system of claim 1 wherein said means (3) includes a secondary sealed vacuum reflector bulb within said solar bulb, and includes a lower convex heat reflecting mirror, and an upper one-way type heat reflecting convex mirror, and, disposed between said two heat reflecting mirrors, is a conventional material which produces luminous light when heated.

6. The system of claim 5 wherein said conventional material is a glowing gas mantle.

7. The system of claim 5 wherein said conventional material is a fluorescent gas.

8. The system of claim 5 including a supplemental source of electricity, whose power is controlled to be dependent inversely on the absolute quantity of said concentrated beam of visible solar energy within said branch line.

9. The system of claim 5 including fan means to withdraw heat from the bulbs, to be vented outdoors to provide a system of light with a minimum of heat.

10. The system of claim 5 including fan means which is operative to circulate heat from the solar bulbs to the indoors or which is inactive to permit radiant indoor heating from the solar bulbs, when required.

11. The system of claim 1 wherein said means (e) includes a secondary sealed vacuum reflector bulb within said solar bulb and is formed of globular one-way mirrored material with a heat-reflecting surface, and, therewithin, is an incandescent filament which creates light when heated.

12. The system of claim 11 including a supplemental source of electricity, whose power is controlled to be dependent inversely on the absolute quantity of said concentrated beam of visible solar energy within said branch line.

13. The system of claim 11 including fan means to withdraw heat from the bulbs, to be vented outdoors to provide a system of light with a minimum of heat.

14. The system of claim 11 including fan means which is operative to circulate heat from the solar bulbs to the indoors or which is inactive to permit radiant indoor heating from the solar bulbs, when required.

* * * * *